(12) United States Patent
Komoike (10) Patent No.: US 6,367,044 B1
(45) Date of Patent: Apr. 2, 2002

(54) SEMICONDUCTOR INTEGRATED CIRCUIT DEVICE

(75) Inventor: Tatsunori Komoike, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/045,365

(22) Filed: Mar. 20, 1998

(30) Foreign Application Priority Data

Nov. 20, 1997 (JP) .............................. 9-319676

(51) Int. Cl.[7] .......................... G01R 31/28; G06F 11/00
(52) U.S. Cl. ....................... 714/739; 365/201
(58) Field of Search ................. 714/224, 733, 714/734, 735, 736, 737, 738, 739, 718–719, 724, 25, 45–47; 365/201, 200, 194, 198; 703/14–15; 324/762; 438/117, 611; 702/120

(56) References Cited

U.S. PATENT DOCUMENTS

| | | | | |
|---|---|---|---|---|
| 3,961,250 A | * | 6/1976 | Snethen | 714/718 |
| 4,555,663 A | * | 11/1985 | Shimizu | 714/738 |
| 4,821,238 A | * | 4/1989 | Tatematsu | 365/201 |
| 4,827,476 A | * | 5/1989 | Garcia | 714/728 |
| 4,969,148 A | * | 11/1990 | Nadeau-Dostie et al. | 714/718 |
| 5,157,781 A | * | 10/1992 | Harwood et al. | 714/30 |
| 5,173,906 A | * | 12/1992 | Dreibebis et al. | 714/733 |
| 5,293,340 A | * | 3/1994 | Fujita | 365/201 |
| 5,301,156 A | * | 4/1994 | Talley | 365/201 |
| 5,420,824 A | * | 5/1995 | Kajimoto et al. | 365/230.01 |
| 5,432,797 A | * | 7/1995 | Takamo | 714/718 |
| 5,495,486 A | * | 2/1996 | Gheewala | 714/724 |
| 5,682,472 A | * | 10/1997 | Brehm et al. | 714/25 |

FOREIGN PATENT DOCUMENTS

| | | | |
|---|---|---|---|
| JP | 5-151017 | 6/1993 | G06F/11/22 |
| JP | 9-171700 | 6/1997 | G11C/29/00 |

OTHER PUBLICATIONS

Jones et al.(Verification techniques for a MIPS compatible embedded control processor; IEEE, Oct. 16, 1991).*
Shimizu et al.( A multimedia 32 b RISC microprocessor with 16 Mb DRAM; IEEE, Feb. 10, 1996).*
Hsieh et al.( A cached system architecture dedicated for the system IO activity on a CPU board; IEEE, Oct. 4, 1989).*
Tanaka et al.(ABSTRACT: A CPU chip–on–board module; IEEE, Feb. 1994).*

* cited by examiner

*Primary Examiner*—Albert Decady
*Assistant Examiner*—Guy Lamarre
(74) *Attorney, Agent, or Firm*—Burns, Doane, Swecker & Mathis, LLP (57) ABSTRACT

In a semiconductor integrated circuit device, a pattern generator 12 generates burn-in test patterns based on control signals received through external terminals 11 and corresponding I/O buffers, and provides the generated burn-in test patterns to input terminals 5 of a DRAM 2. The burn-in test operation is performed only by using the control signals received through the external terminals 11 and the corresponding I/O buffers. The burn-in test operation is performed by a small number of access operations to the I/O buffers because the number of the access operations to the I/O buffers may be decreased when comparing with a conventional one. Thereby, the accuracy of the reliability test for the DRAM 2 may be increased.

4 Claims, 5 Drawing Sheets

SEMICONDUCTOR INTEGRATED CIRCUIT DEVICE

BACKGROUND OF THE INVENTION

1. Field of the Invention

The present invention relates to a semiconductor integrated circuit device in which a central processing unit (CPU) or a logic circuit, and direct random access memory (DRAM) are mounted on a semiconductor chip, and, more particularly, to a semiconductor integrated circuit device capable of performing burn-in test efficiently, in which a central processing unit (CPU) or a logic circuit, and dynamic random access memory (DRAM) are mounted on a semiconductor chip.

2. Description of the Prior Art

Figure 6:
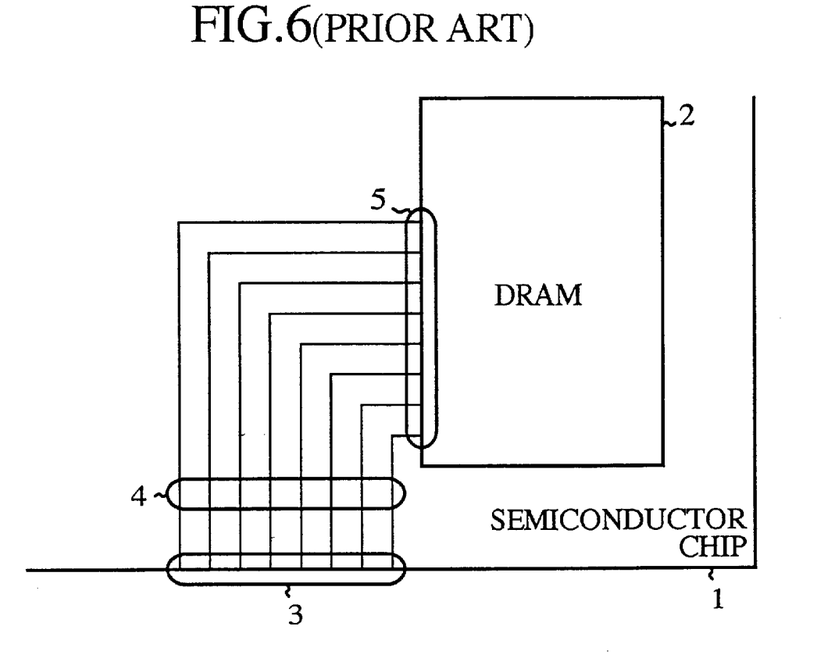
FIG. 6 is a block diagram showing a configuration of a conventional semiconductor integrated circuit device on a semiconductor chip on which a DRAM is mounted.

FIG. 6 is a block diagram showing a configuration of a conventional semiconductor integrated circuit device on a semiconductor chip 1 on which a dynamic random access memory (DRAM) is mounted. In FIG. 6, the reference number 1 designates a semiconductor chip, 2 denotes a dynamic random access memory (DRAM) mounted on the semiconductor chip 1, 3 indicates an external terminal group having a plurality of external terminals through which burn-in test patterns are provided from external devices (not shown) to the semiconductor chip 1 and the burn-in test patterns are used for operation test of the DRAM 2. The reference number 4 designates a wiring group having a plurality of lines through which the received burn-in test patterns are transferred to the DRAM 2. The reference number 5 denotes input terminal group having a plurality of input terminals of the DRAM 2. Further, input/output buffers (I/O buffers that are omitted from FIG. 6) whose number is corresponding to the number of the external terminals in the external terminal group 3 are formed in the semiconductor chip 1.

Figure 7:
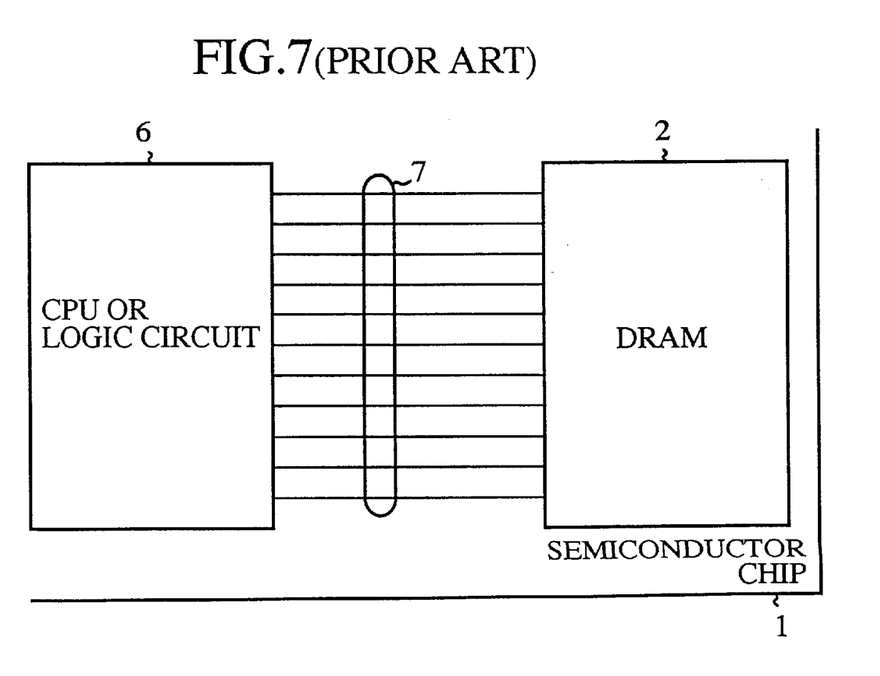
FIG. 7 is a block diagram showing a configuration of another conventional semiconductor integrated circuit device formed on a semiconductor chip on which a CPU or a logic circuit and a DRAM are mounted.

FIG. 7 is a block diagram showing a configuration of another conventional semiconductor integrated circuit device formed on a semiconductor chip 1 on which a central processing unit (CPU) or a logic circuit and a DRAM are mounted. The reference number 6 designates the CPU or the logic circuit and 2 indicates the DRAM. The reference number 7 indicates a wiring group having a plurality of lines through which the CPU or the logic circuit 6 and the DRAM 2 are connected.

Next, a description will be given of the operation of the semiconductor integrated circuit device shown in FIG. 6.

In general, a burn-in test for the DRAM 2 is the test of a reliability performance measurement in order to detect a life time of the DRAM 2. When the burn-in test for the DRAM 2 in the configuration of the semiconductor chip 1 shown in FIG. 6 is performed, burn-in test patterns are inputted through the external terminal group 3 and the I/O buffers (not shown) in the semiconductor chip 1, and then the received burn-in test patterns are transferred to the input terminal group 5 of the DRAM 2 through the wiring group 4.

In the conventional semiconductor integrated circuit device shown in FIG. 6, after the burn-in test patterns are provided to the DRAM 2, test results obtained from the DRAM 2 are transferred to external devices through the external terminal group 3 and then the test results are compared with the burn-in test patterns in order to perform the reliability test of the operation of the DRAM 2.

FIG. 7 shows the configuration of the conventional semiconductor integrated circuit device of a hybrid type in which both the CPU or the logic circuit 6 and the DRAM 2 are mounted on the same semiconductor chip 1. This hybrid type semiconductor device is becoming one of the leading mainstreams of large scale hybrid integrated semiconductor circuit devices. By using the configuration of the semiconductor integrated circuit device shown in FIG. 7, it is possible to avoid a drawback caused in the configuration of an interface between a chip of the CPU or the logic circuit 6 and a chip of the DRAM 2. On the contrary, the configuration shown in FIG. 7 has the wiring group 4 having a plurality of lines through which the CPU or the logic circuit 6 are connected to the DRAM 2 electrically. In the prior art, when the burn-in test for the DRAM 2 is performed in the configuration shown in FIG. 7, there is a drawback that it is difficult to input burn-in test patterns directly to the DRAM 2 through an external terminal group and corresponding I/O buffers (omitted from FIG. 7) and difficult to perform the burn-in test for the DRAM 2 correctly.

As described above, because the conventional semiconductor integrated circuit device has the configuration shown in FIG. 6 in which only the DRAM 2 is formed on the semiconductor chip 1, when the burn-in test is performed, it must be required to have the external terminal group 3, the I/O buffers, and the lines forming the wiring group 4 whose number is corresponding to the number of the input terminals of the DRAM 2. Accordingly, there is a case that it is difficult to form the dedicated terminals for the burn-in test pattern in the semiconductor chip in configuration.

In addition, according to the development of large scale integrated circuit devices as DRAM 2, it must be required to form a plurality of dedicated terminals in the external terminal group 3 and I/O buffers only for the test of the DRAM 2 under the limitation of the number of the terminals in the external terminal group 3 and the I/O buffers in the semiconductor chip 1. In addition to this drawback, in the prior art, there is another drawback that the wiring group 4 requires a larger area in the semiconductor chip 1 under the limitation of the area of the semiconductor chip 1. Furthermore, because the burn-in test is the reliability test only for the DRAM 2, not for the CPU, the logic circuit, and the wiring group as component elements other than the DRAM 2 mounted on the same semiconductor chip 1, it is required to minimize the number of the component elements other than the DRAM 2. However, a plurality of I/O buffers are formed corresponding to the number of the terminals in the external terminal group 3, and operate. This causes to add the influence of the defects of the component elements, such as the I/O buffers, other than the DRAM 2 into the test result of the burn-in test only for the DRAM 2. Thereby, this causes to decrease the accuracy of the reliability of the test result of the burn-in test for the DRAM 2.

Moreover, the wiring group 7 having a plurality of lines is formed between the CPU or the logic circuit 6 and the DRAM 2 in the conventional hybrid type semiconductor integrated circuit device shown in FIG. 7 in which the CPU or the logic circuit 6 and the DRAM 2 are mounted on the same semiconductor chip 1. Accordingly, there is the drawback that when the burn-in test for the DRAM 2 is performed, it is difficult to input burn-in test patterns directly to the DRAM 2 through external terminals and corresponding I/O buffers (omitted from FIG. 7) and it is also difficult to perform the burn-in test for the DRAM 2 correctly.

SUMMARY OF THE INVENTION

Accordingly, an object of the present invention is, with due consideration of the drawbacks of the conventional semiconductor integrated circuit device, to provide a semiconductor integrated circuit device as a hybrid type semiconductor integrated circuit device, in which a CPU or a logic circuit and a DRAM are mounted on a same semiconductor chip, capable of performing a burn-in test for the DRAM without increasing the number of external terminals, I/O buffers, and wiring group in the semiconductor chip.

In accordance with a preferred embodiment of the present invention, a semiconductor integrated circuit device comprises a central processing unit (CPU) or a logic circuit mounted on a same semiconductor chip, a dynamic random access memory (DRAM) mounted on the same semiconductor chip, and a pattern generator for generating burn-in test patterns for the DRAM based on control signals received through external terminals of the same semiconductor chip and for providing the generated burn-in test patterns to input terminals of the DRAM. In the semiconductor integrated circuit device described above, the number of the input terminals of the DRAM is greater than the number of the external terminals of the same semiconductor chip.

The semiconductor integrated circuit device as another preferred embodiment according to the present invention, further comprises a switch circuit for switching a first wiring group through which the burn-in test patterns generated by the pattern generator are transferred to the input terminals of the DRAM and a second wiring group through which data items are transferred from the CPU or the logic circuit to the DRAM, and for connectingly switched one in the first wiring group and the second wiring group to the input terminals of the DRAM.

In accordance with another preferred embodiment of the present invention, a semiconductor integrated circuit device comprises a central processing unit (CPU) or a logic circuit mounted on a same semiconductor chip, a dynamic random access memory (DRAM) mounted on the same semiconductor chip, and a pattern generator, formed in the CPU or the logic circuit, for generating burn-in test patterns for the DRAM based on control signals received through external terminals of the same semiconductor chip and for providing the generated burn-in test patterns to input terminals of the DRAM. In the semiconductor integrated circuit device described above, the number of the input terminals of the DRAM is greater than the number of the external terminals of the same semiconductor chip.

In the semiconductor integrated circuit device as another preferred embodiment according to the present invention, a wiring group through which the burn-in test patterns are transferred from the pattern generator to the input terminals of the DRAM is commonly used during a normal operation other than a burn-in test operation in which data items are transferred to the CPU or the logic circuit to the input terminals of the DRAM.

In the semiconductor integrated circuit device as another preferred embodiment according to the present invention, the switch circuit is a selector group comprising a plurality of selectors for switching the first wiring group through which the burn-in test patterns generated by the pattern generator are transferred to the input terminals of the DRAM and the second wiring group through which data items are transferred from the CPU or the logic circuit to the DRAM, and for connectingly switched one in the first wiring group and the second wiring group to the input terminals of the DRAM.

BRIEF DESCRIPTION OF THE DRAWINGS

These and other objects, features, aspects and advantages of the present invention will become more apparent from the following detailed description of the present invention when taken in conjunction with the. accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of the semiconductor integrated circuit device according to the present invention will now be described with reference to the drawings.

First Embodiment

Figure 1:
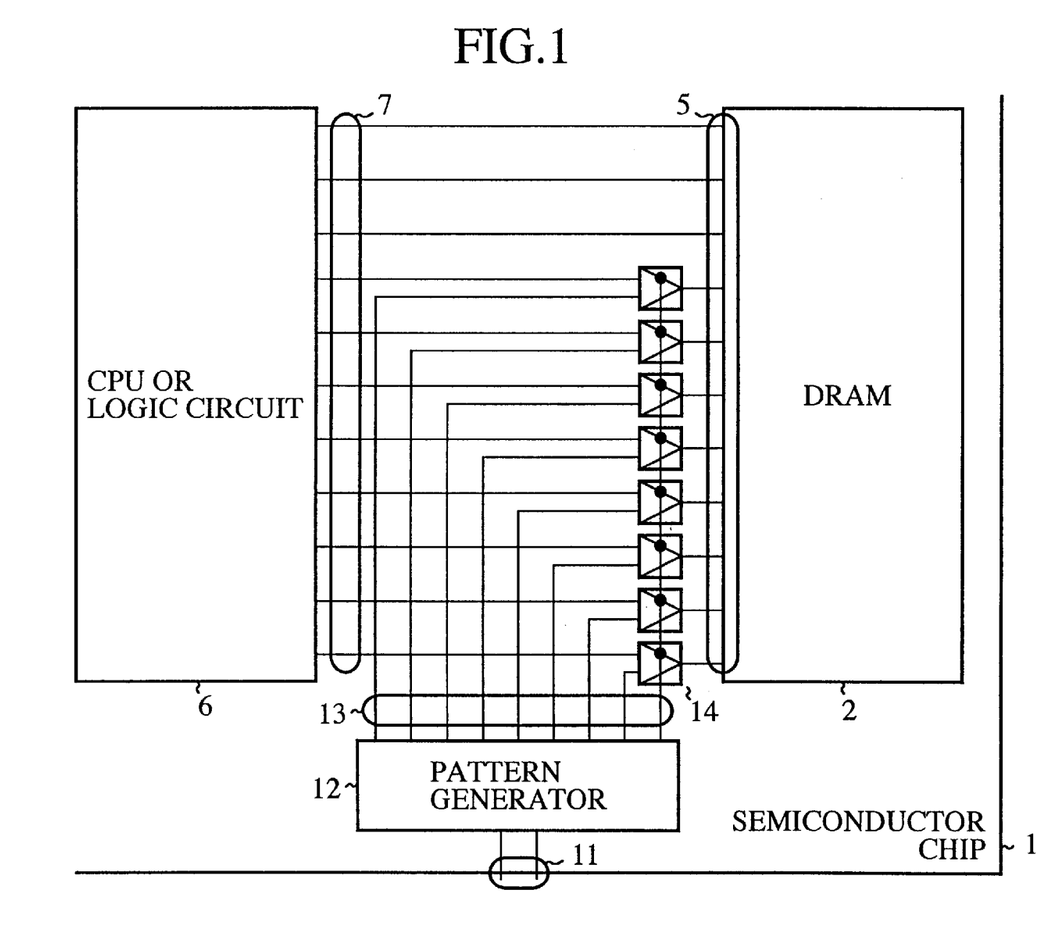
FIG. 1 is a block diagram showing a configuration of a semiconductor integrated circuit device formed on a semiconductor chip on which a CPU or a logic circuit and a DRAM are mounted, as the first embodiment of the present invention.

FIG. 1 is a block diagram showing a configuration of a semiconductor integrated circuit device of a hybrid type formed on a semiconductor chip on which a central processing unit (CPU) or a logic circuit and a dynamic random access memory (DRAM) are mounted, as the first embodiment according to the present invention. In FIG. 1, the reference number 1 designates a semiconductor chip and 2 denotes a DRAM mounted on the same semiconductor chip 1. The reference number 5 denotes an input terminal group having a plurality of input terminals of the DRAM 2. The reference number 6 indicates a CPU or a logic circuit mounted on the semiconductor chip 1, and 7 denotes a wiring group having a plurality of lines through which the CPU or the logic circuit 6 are electrically connected to the input terminal group 5 of the DRAM 2. The above components of the semiconductor integrated circuit device as the first embodiment described above are the same as those of the conventional semiconductor integrated circuit device shown in FIGS. 6 and 7.

In FIG. 1, the reference number 11 designates an external terminal group having two external terminals through which various control signals such as a clock control signal and a cell control signal are inputted to the semiconductor chip 1. The two external terminals in the external terminal group 11 are shown in the configuration shown in FIG. 1. The reference number 12 designates a pattern generator, mounted on the semiconductor chip 1 for generating test patterns to be used for burn-in test of the DRAM 2 corresponding to the control signals received through the external terminal group 11.

The reference number 13 denotes a wiring group having a plurality of lines to provide the burn-in test patterns generated by the pattern generator 12 to the DRAM 2. In the configuration shown in FIG. 1, the eight lines are formed as the wiring group 13 whose number is greater than the number of the external terminal group 11. The reference number 14 indicates a selector group (as a switching circuit) to switch the wiring group 13 and the wiring group 7. The operation of the selector group 14 is controlled by the burn-in test patterns generated by the pattern generator 12.

Figure 2:
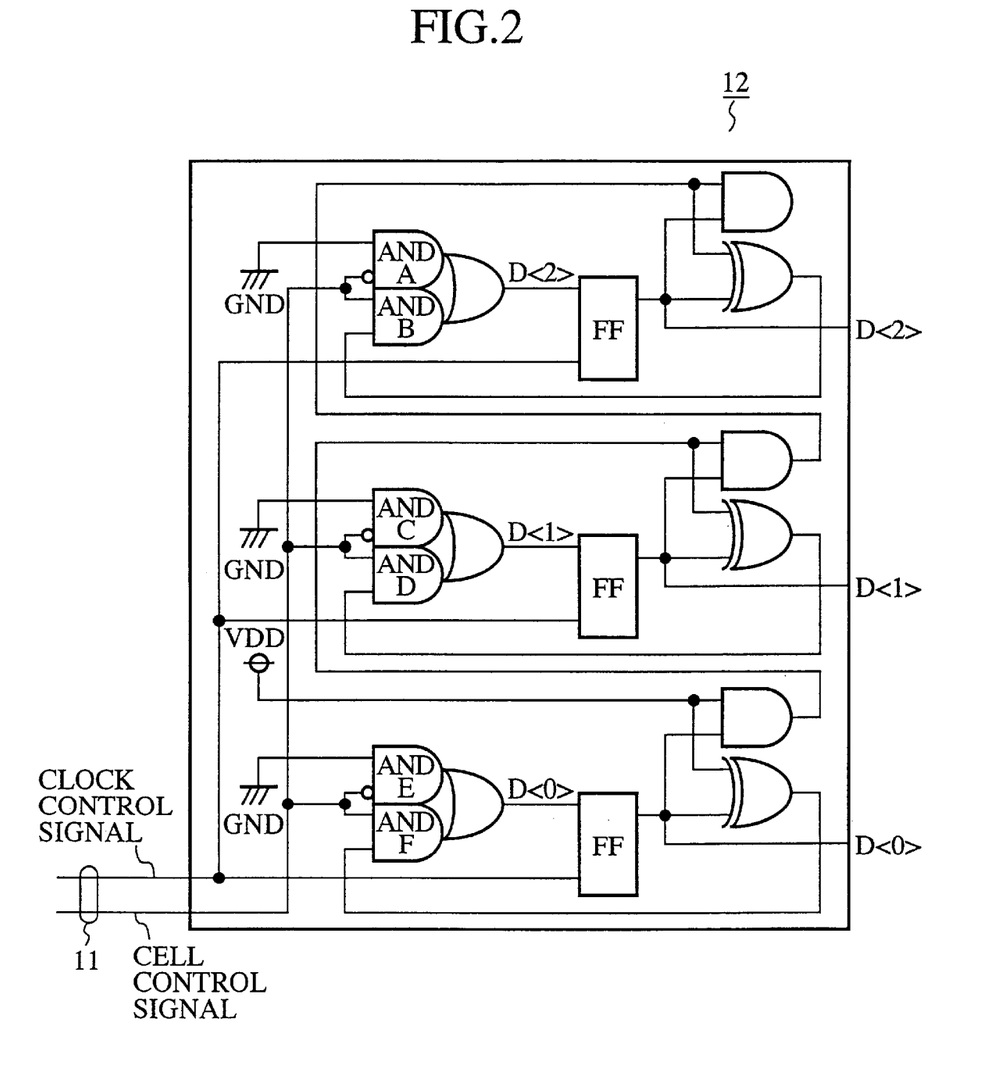
FIG. 2 is a block diagram showing a detailed configuration of a pattern generator formed in the semiconductor integrated circuit as the first embodiment shown in FIG. 1.

FIG. 2 is a block diagram showing a detailed configuration of a pattern generator formed in the semiconductor integrated circuit as the first embodiment shown in FIG. 1. In FIG. 2, both the clock control signal and the cell control signal are inputted through the terminals in the external terminal group 11 in the semiconductor chip 1, the pattern generator 12 generates three burn-in test data items D<0>, D<1>, and D<2>according to the received clock control signal and the cell control signal, then provides the three burn-in test data items D<0>, D<1>, and D<2>to the DRAM 2 through the lines in the wiring group 13 and the selector group 14.

Figure 3:
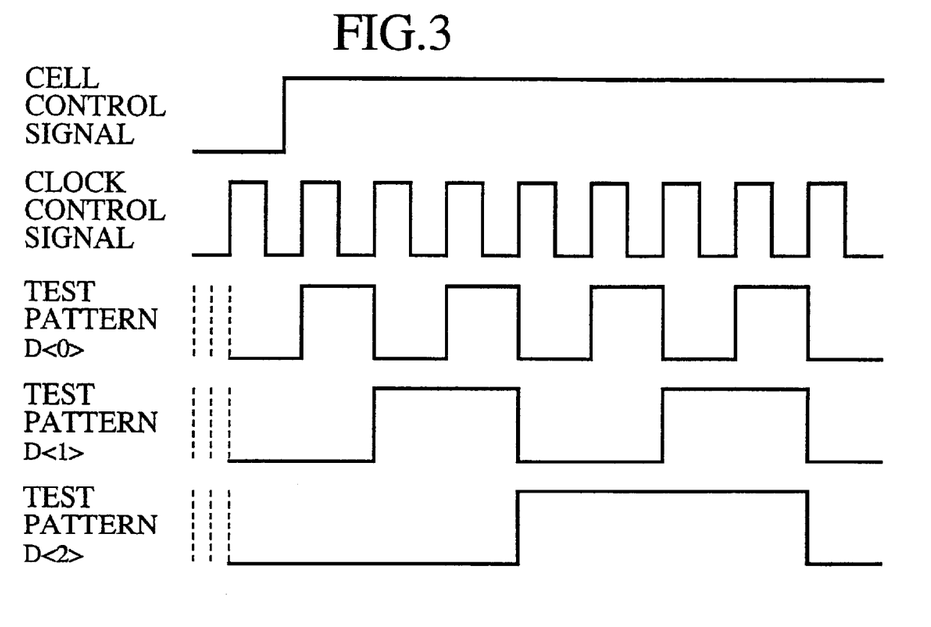
FIG. 3 is a timing chart showing a relationship among a clock control signal, a cell control signal, and test patterns D<0>, D<1>, D<2>.

FIG. 3 is a timing chart showing the relationship among the clock control signal, the cell control signal, and the generated test patterns D<0>, D<1>, and D<2>.

Next, a description will be given of the operation of the semiconductor integrated circuit device as the first embodiment.

FIG. 1 shows the semiconductor integrated circuit device as a hybrid type semiconductor integrated circuit in which both the CPU or the logic circuit and the DRAM 2 are incorporated. This hybrid type semiconductor circuit devices is becoming one of the leading mainstreams of large scale integrated semiconductor circuit devices. The semiconductor integrated circuit device having the configuration of the first embodiment shown in FIGS. 1 and 2 is capable of eliminating the drawbacks, in the semiconductor integrated circuit device as the prior art, such as the delay of signal transfer, noise, and the increasing of power consumption caused at the interface between the CPU or the logic circuit 6 and the DRAM 2.

In the semiconductor integrated circuit of the first embodiment shown in FIG. 1, when normal operation other than the burn-in test operation is performed, the selector group 14 selects to electrically connect the wiring group 7 to the input terminal group 5 of the DRAM 2. Then, data writing operation to the DRAM 2 and data reading operation from the DRAM 2 are performed.

Next, when the burn-in test for the DRAM 2 as the test of a reliability performance measurement to detect the life time of the DRAM 2 is performed, the clock control signal and the cell control signal are inputted through the external terminal group 11 and the I/O buffers (not shown) in the semiconductor chip 1, and the pattern generator 12 then indicates the selector group 14 according to the received control signals. Thereby, the wiring group 13 is electrically connected to the input terminal group 5 of the DRAM 2 through the selector group 14, and the burn-in test patterns generated by the pattern generator 12 are transferred to the DRAM 2. In the semiconductor integrated circuit device as the first embodiment shown in FIG. 1, after the burn-in test patterns generated by the pattern generator 12 are provided to the DRAM 2, test results provided from the DRAM 2 are transferred to external devices (not shown) through the input terminal group 5, the wiring group 13, the pattern generator 12, and the external terminal group 11, and the test results are then compared with the burn-in test patterns in order to perform the reliability test of the operation of the DRAM 2.

FIG. 2 shows a three-bit incrementer as an example of the detailed configuration of the pattern generator 12 in the semiconductor integrated circuit of the first embodiment.

In the operation of the pattern generator 12, first, a cell number is set to the value "0" based on the cell control signal received through the external terminal group 11. Thereby, the AND gates A, C, and E become enable, and input value of the flip flop FF is set to "0". Further, when the pattern generator 12 receives the clock control signal through the external terminal group 11, the three flip flops FF in the pattern generator 12 output data items D<0>, D<1>, and D<2>of [000].

Next, a cell number is set to the value "1" based on the cell control signal received through the external terminal group 11. Thereby, the AND gates B, D, and F become enable. The AND gates B, D, and F receive the data [001] based on the output value obtained by the external OR operation between the output value [000] of each of the flip flops FF and the voltage potential VDD of the ground (GND) and the AND gates. As a result, the three outputs D<0>, D<1>, and D<2>of the data value [001] of the flip flops FF are generated by the pattern generator 12 according to the value of the following clock control signal received through the external terminal group 11.

Thus, according to the value of the received clock control signal, the flip flop FF in the pattern generator 12 shown in FIG. 2 may output the data items [000], [010], [011], [100], [101], [110], and [111]. Those data items of the flip flops FF are transferred to the DRAM 2 as the burn-in test patterns.

In the semiconductor integrated circuit device as the first embodiment, the three-bit incrementer is shown as one example of the pattern generator 12, the present invention is not limited by this example, for example, it is possible to form the pattern generator 12 that is capable of generating various values of burn-in test patterns and then provides these various values of burn-in test patterns to the DRAM 2 through the input terminal group 5. That is, the pattern generator 12 formed in the semiconductor integrated circuit device of the first embodiment receives the two control signals such as the clock control signal and the cell control signal, and generates eight values of burn-in test patterns, namely [000], [010], [011], [100], [101], [110], and [111]. However, the present invention is not limited by this example, for example, it is possible to determine the number of the input control signals and the burn-in test patterns based on a desired condition as long as the number of outputs of the burn-in test patterns generated by the pattern generator 12 is greater than the number of the control signals received by the external terminal group 11.

As described above, according to the semiconductor integrated circuit device as the first embodiment as the hybrid type semiconductor integrated circuit device on which the CPU or the logic circuit and the DRAM are mounted on a same semiconductor chip, it is possible to generate and provide burn-in test patterns and to perform the burn-in test for the DRAM 2 by the switching of the selector 14. In addition to this feature, because the pattern generator 12 may generate a plurality of the burn-in test patterns based on the control signals, received through the external terminal group 11 and the I/O buffers (not shown), whose number is smaller than the number of the generated burn-in test patterns, it is possible to satisfy the limitation of the number of the external terminals and the I/O buffers in the semiconductor chip. This causes to decrease the access operation to the I/O buffers during the burn-in test operation. Thus, the present invention may decrease the number of components in the semiconductor integrated circuit device and increases the accuracy of the reliability test of the operation of the DRAM 2.

Second Embodiment

Figure 4:
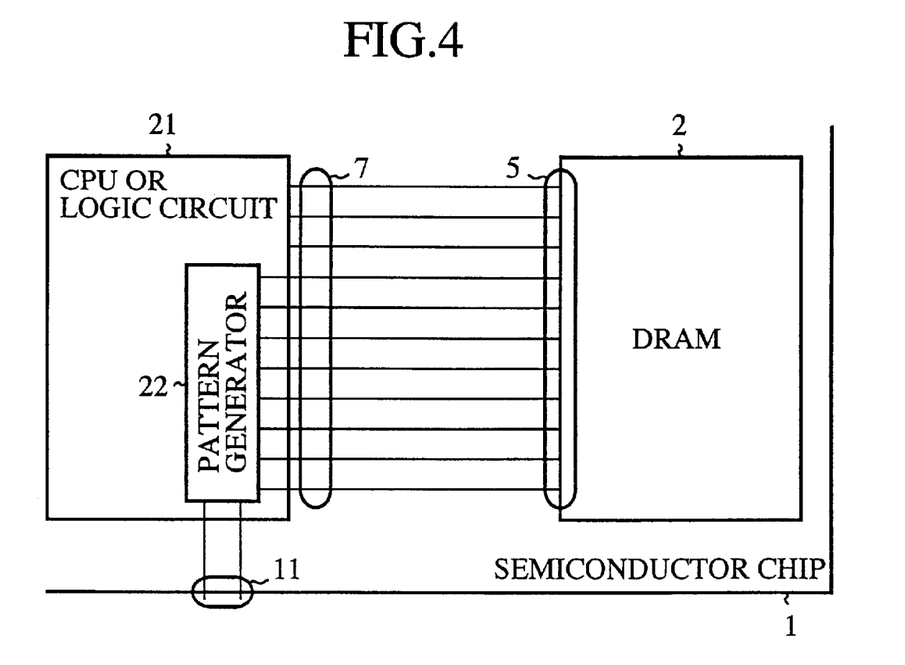
FIG. 4 is a block diagram showing a configuration of a semiconductor integrated circuit device formed on a semiconductor chip on which a CPU or a logic circuit and a DRAM are mounted, as the second embodiment of the present invention.

FIG. 4 is a block diagram showing a configuration of the semiconductor integrated circuit device of a hybrid type formed on a semiconductor chip on which a CPU or a logic circuit and a DRAM are mounted, as the second embodiment of the present invention. In FIG. 21, the reference number 21 designates a CPU or a logic circuit mounted on a semiconductor chip 1. The reference number 22 denotes a pattern generator for incorporation in the CPU 1 or the logic circuit 21. The pattern generator is designed and formed in the CPU or the logic circuit 21 in optimum configuration and optimum area. The pattern generator 22 receives the control signals through the external terminal group 11 and generates the burn-in test patterns according to the value of the received control signals. In the configuration shown in FIG. 4, the wiring connected between the pattern generator 22 and the input terminal group 5 of the DRAM 2 is commonly used by the wiring group connected between the CPU or the logic circuit 21 and the input terminal group 5 of the DRAM 2, that is used in normal operation, not in the burn-in test operation.

Other component elements in the semiconductor integrated circuit device as the second embodiment shown in FIG. 4 are the same as those of the first embodiment shown in FIG. 1, therefore, the explanation of them is omitted here for brevity.

Next, a description will be given of the operation of the semiconductor integrated circuit device as the second embodiment.

The normal operation other than the burn-in test operation is performed in the semiconductor integrated circuit as the second embodiment, data items are transferred between the CPU or the logic circuit 21 and the DRAM 2 through the wiring group 7 having a plurality of lines in data writing operation to the DRAM 2 and the data reading operation from the DRAM 2.

Next, when the burn-in test operation to the DRAM 2 is performed, the pattern generator 22 receives the clock control signal and the cell control signal through the external terminal group 11 and the I/O buffer (not shown), and then generates the burn-in test patterns for the DRAM 2 based on the received control signals. In the semiconductor integrated circuit device of the second embodiment, the lines in the wiring group are commonly used in both the normal operation (in which data items are transferred between the CPU or the logic circuit 21 and the input terminal group 5 of the DRAM 5) and the burn in test operation (in which the burn-in test patterns are transferred between the pattern generator 22 and the and the input terminal group 5 of the DRAM 5). After the burn-in test patterns generated by the pattern generator 22 are provided to the DRAM 2, test results provided from the DRAM 2 are transferred to external devices (not shown) through the terminals in the input terminal group 5 of the DRAM 2, the lines in the wiring group 7, the pattern generator 22, and the external terminals in the external terminal group 11, and the test results are then compared with the burn-in test patterns in order to perform the reliability test of the operation of the DRAM 2.

Figure 5A:
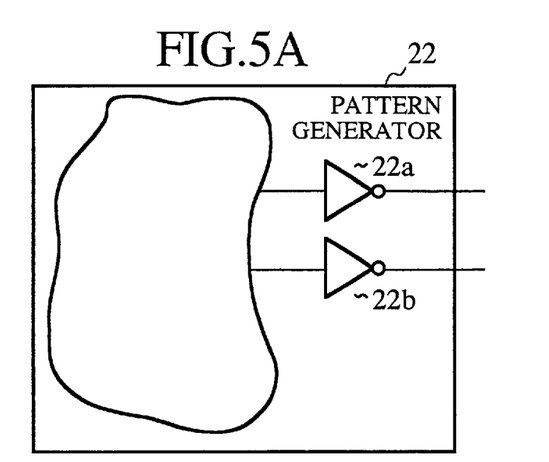
FIGS. 5A to 5C are explanation diagrams showing the configurations of the optimum location of the pattern generator formed in the CPU or the logic circuit.
Figure 5B:
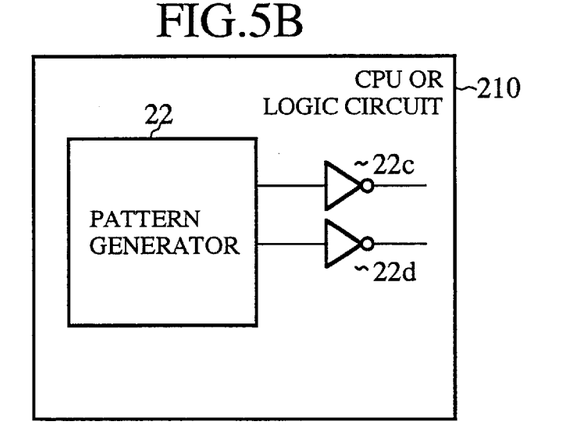
Figure 5C:
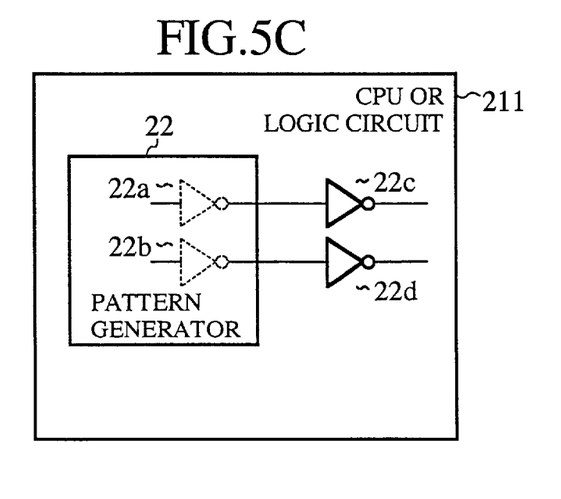

FIGS. 5A to 5C are explanation diagrams showing the configurations of the optimum location of the pattern generator 22 formed in the CPU or the logic circuit.

In FIG. 5A, first, the pattern generator 22 is designed independently so that outputs of the pattern generator 22 are transferred to the DRAM 2 (omitted from FIGS. 5A to 5C) through two invertors 22a and 22b.

In addition, as shown in FIG. 5B, after the CPU or the logic circuit 210 is designed independently, the pattern generator 22 is designed so that the pattern generator 22 is formed in the CPU or the logic circuit 210 and the outputs from the pattern generator 22 are transferred through the invertors 22c and 22d incorporated in the CPU or the logic circuit 210. In the pattern generator 22 formed in the semiconductor integrated circuit device of the second embodiment by the optimum design, the outputs of the pattern generator 22 are output through the invertors 22a and 22b (see FIG. 5A). Furthermore, when the outputs from the pattern generator 22 are obtained through the invertors 22c and 22d in the CPU or the logic circuit 210 (see FIG. 5B), as shown by the dotted lines in the CPU or the logic circuit 211 shown in FIG. 5C, it is possible to eliminate the invertors 22a and 22b as an interface section in the pattern generator 22. This causes to increase the integration of the semiconductor integrated circuit device by the eliminated area of the invertors 22a and 22b.

Thus, it is possible to eliminate circuit components or to use the circuit components commonly, or to combine the circuit components with circuit components in the pattern generator 22 by forming the pattern generator 22 in the CPU or the logic circuit. This causes to decrease the circuit area of the semiconductor integrated circuit device of the second embodiment when comparing with the circuit area of the semiconductor integrated circuit device of the first embodiment.

As described above, according to the semiconductor integrated circuit device of the second embodiment, it is possible to perform the burn-in test in the hybrid type semiconductor integrated circuit device on which the CPU or the logic circuit and the DRAM are formed on a same semiconductor chip. In addition to the effect, it is possible to satisfy the limitation of the number of external terminals and I/O buffers in the semiconductor chip. That is, it is possible to perform the burn-in test operation under a small number of external terminals and I/O buffers in the semiconductor chip. This causes to increase the accuracy of the reliability test for the DRAM 2.

Furthermore, because the wiring, through which the burn-in test patterns are transferred from the pattern generator 22 to the input terminal group 5 of the DRAM 2, may be used as the wiring for use in the normal operation, it is not required to form any dedicated wiring only for use in the burn-in test operation. This causes to decrease the area for the wiring, so that it is possible to increase the integration of the semiconductor chip.

Moreover, when the pattern generator 22 is formed at optimum positions in the CPU or the logic circuit 21, it is possible to eliminate circuit components, or to use the circuit components commonly, or to combine the circuit components in the pattern generator with the components in the pattern generator 21. This causes to decrease the area, so that it is possible to increase the integration of the semiconductor chip.

As set forth, according to the semiconductor integrated circuit device of the present invention, even if the type of a semiconductor integrated circuit device is a hybrid type, namely even if a CPU or logic circuit and a DRAM are mounted on a same semiconductor chip, it is possible to perform the burn-in test. In addition, it is also possible to perform the burn-in test for the DRAM under a smaller number of external terminals and corresponding I/O buffers in the semiconductor chip. This provides the effect to satisfy the limitation of the number of the external terminals and corresponding I/O buffers in the semiconductor integrated circuit device, and to increase the accuracy of a reliability test of the DRAM.

In addition, according to the semiconductor integrated circuit device of the present invention, because the normal operation and the burn-in test operation may be switched by a switch circuit, it is possible to form dedicated wiring only for use in the burn-in test operation. This causes to decrease the wiring area in the semiconductor integrated circuit.

Furthermore, according to the semiconductor integrated circuit device of the present invention, because the pattern generator may be formed in optimum design in the CPU or the logic circuit, it is possible to eliminate circuit components of the logic circuit, or to use the circuit components commonly, or to combine the circuit components in the CPU or the logic circuit with circuit components in the pattern generator.

Moreover, according to the semiconductor integrated circuit device of the present invention, because the wiring through which the pattern generator and the input terminal group of the DRAM may be commonly used in the burn-in test operation and the normal operation, it is possible to decrease the wiring area in the semiconductor integrated circuit.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A semiconductor integrated circuit device comprising:

a central processing unit (CPU) or a logic circuit mounted on a same semiconductor chip;

a dynamic random access memory (DRAM) mounted on the same semiconductor chip;

a pattern generator for generating burn-in test patterns for the DRAM based on control signals received through external terminals of the same semiconductor chip and for providing the generated burn-in test patterns to input terminals of the DRAM; and a switch circuit for connecting a first wiring group through which the burn-in test patterns generated by the pattern generator are transferred to the input terminals of the DRAM and for connecting a second wiring group through which data items are transferred from the CPU or the logic circuit to the input terminals of the DRAM.

2. The semiconductor integrated circuit device of claim 1, wherein the switch circuit is a selector group comprising a plurality of selectors for connecting the first wiring group through which the burn-in test patterns generated by the pattern generator are transferred to the input terminals of the DRAM and for connecting the second wiring group through which data items are transferred from the CPU or the logic circuit to the input terminals of the DRAM.

3. A semiconductor integrated circuit device comprising:

a central processing unit (CPU) mounted on a same semiconductor chip;

a dynamic random access memory (DRAM) mounted on the same semiconductor chip; and a pattern generator, formed in the CPU, for generating burn-in test patterns for the DRAM based on control signals received through external terminals of the same semiconductor chip and for providing the generated burn-in test patterns to input terminals of the DRAM.

4. The semiconductor integrated circuit device as claimed in claim 3, wherein a wiring group through which the burn-in test patterns are transferred from the pattern generator to the input terminals of the DRAM is commonly used during a normal operation other than a burn-in test operation in which data items are transferred to the CPU to the input terminals of the DRAM.

* * * * *